United States Patent [19]
Sakai et al.

[11] Patent Number: 5,070,813
[45] Date of Patent: Dec. 10, 1991

[54] COATING APPARATUS

[75] Inventors: Hiroyuki Sakai, Koshi; Eiichi Shirakawa; Chizo Yamaguchi, both of Kumamoto; Takashi Takekuma, Yamaga, all of Japan

[73] Assignees: Tokyo Electron Limited, Tokyo; Tel Kyushu Limited, Kumamoto, both of Japan

[21] Appl. No.: 472,813

[22] Filed: Jan. 31, 1990

[30] Foreign Application Priority Data

Feb. 10, 1989 [JP] Japan .................................. 1-31925
Sep. 25, 1989 [JP] Japan .................................. 1-250066

[51] Int. Cl.$^5$ .............................................. B05C 5/00
[52] U.S. Cl. .................................... 118/695; 118/708; 118/710; 118/730; 118/50; 118/319; 137/111; 417/300
[58] Field of Search ............... 118/729, 730, 319, 320, 118/52, 53, 54, 663, 686, 695, 696, 684, 685, 708, 50, 710, 692; 137/111, 487.5; 417/300

[56] References Cited

U.S. PATENT DOCUMENTS

| 3,730,134 | 5/1973 | Kadi | 118/50 |
| 4,016,828 | 4/1977 | Maher et al. | 118/52 |
| 4,760,822 | 8/1973 | Evans | 118/730 |
| 4,821,674 | 4/1989 | DeBoer et al. | 118/730 |
| 4,980,204 | 12/1990 | Fujii et al. | 118/730 |

FOREIGN PATENT DOCUMENTS

| 58-178522 | 10/1983 | Japan . |
| 59-82975 | 5/1984 | Japan . |
| 60-139363 | 7/1985 | Japan . |
| 62-102854 | 5/1987 | Japan . |

Primary Examiner—Willard Hoag
Attorney, Agent, or Firm—Oblon, Spivak, McClelland, Maier & Neustadt

[57] ABSTRACT

Disclosed is a coating apparatus, comprising a gas exhaust rate controller disposed within an exhaust pipe connected to a cup which houses a substance to be treated, and a branch pipe connected to the exhaust pipe. The flow speed of the fluid within the branch pipe is measured, and the driving of the exhaust rate controller is controlled based on the measured value of the flow speed in accordance with the state of treatment of the object to be treated.

8 Claims, 3 Drawing Sheets

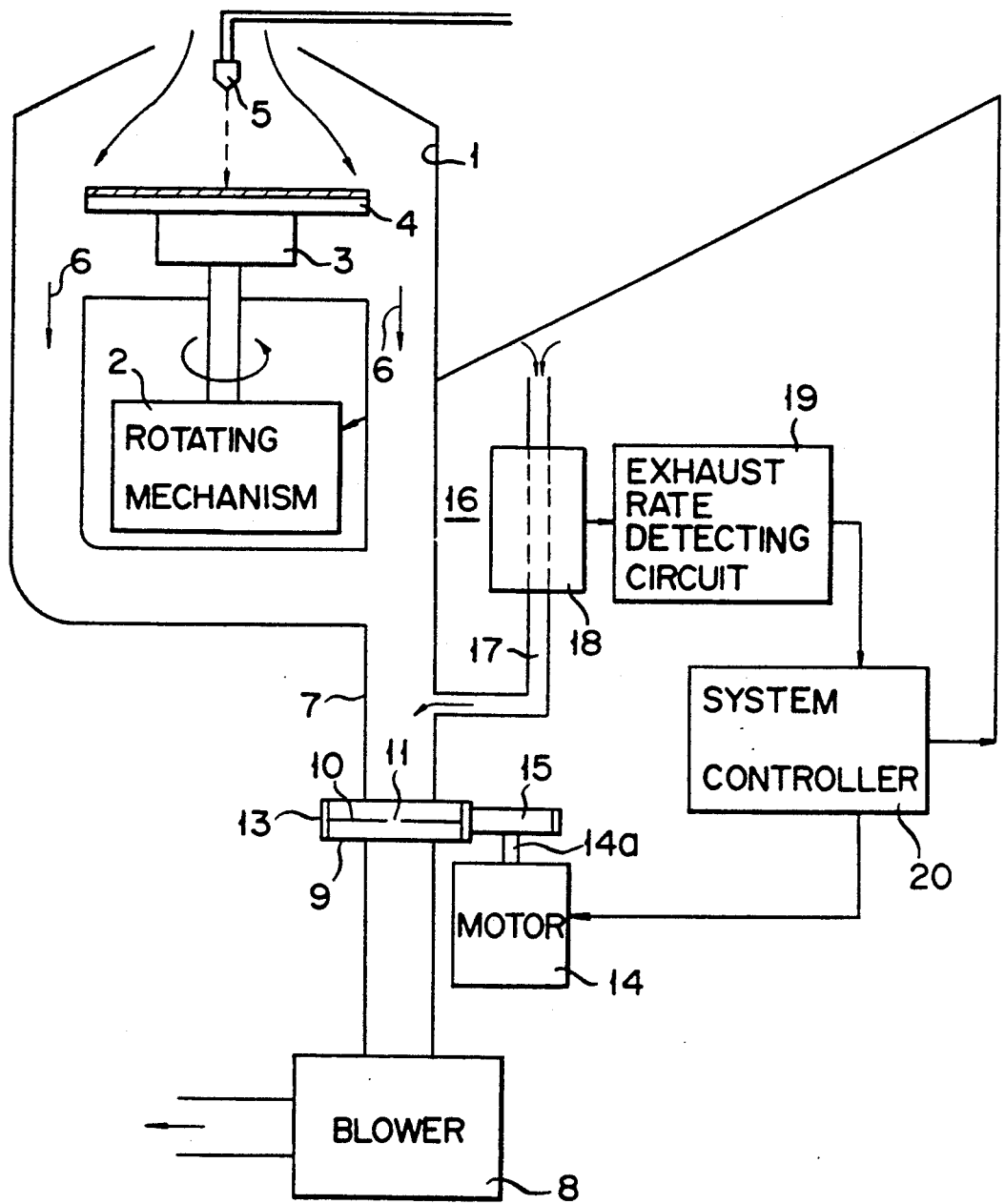
F I G. 1

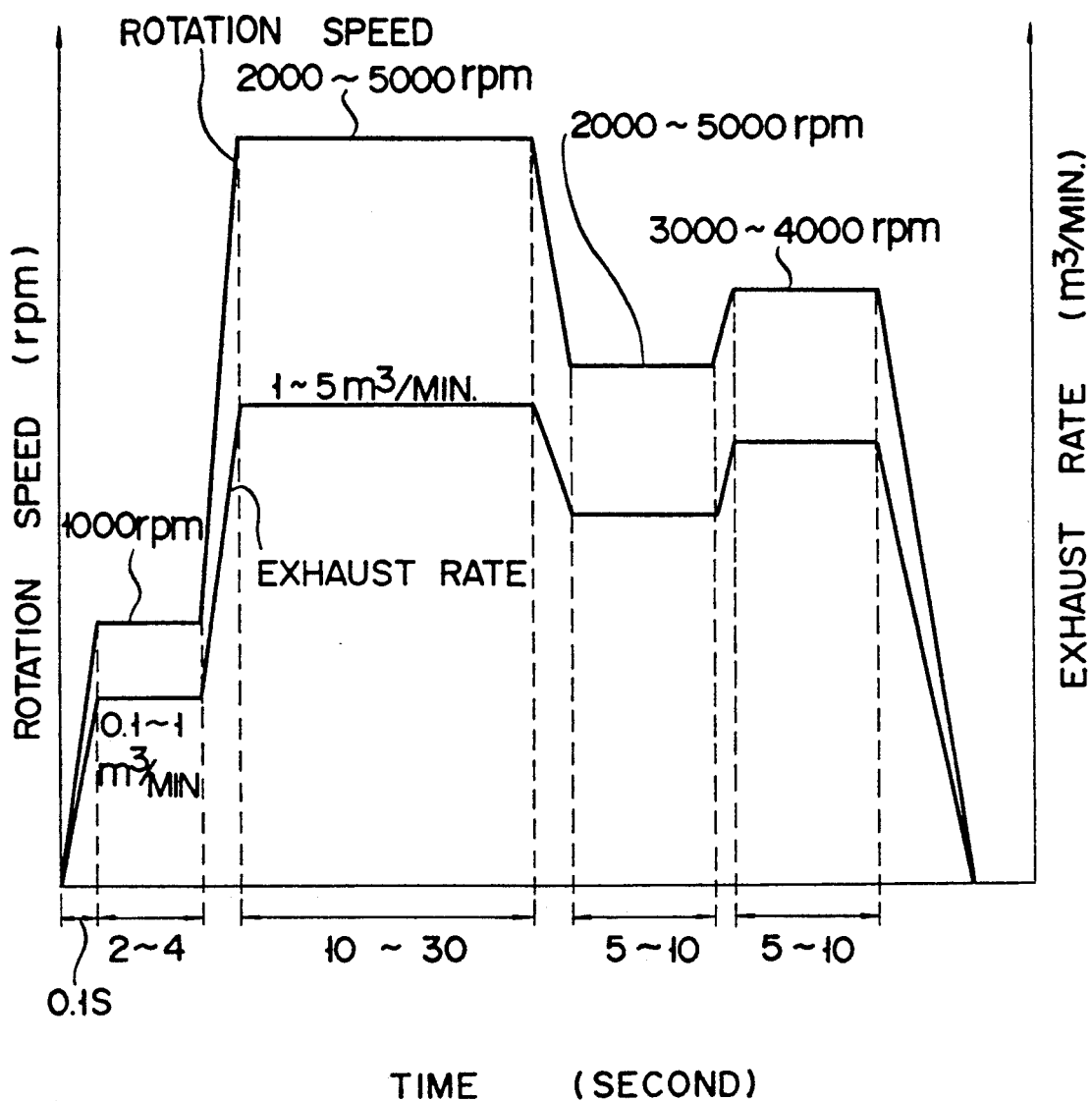
F I G. 3

COATING APPARATUS

BACKGROUND OF THE INVENTION

1. Field of the Invention

The present invention relates to a coating apparatus for coating liquid materials such as a resist and developing solution.

2. Description of the Related Art

A coating apparatus is used for coating a semiconductor wafer for forming a photoresist film. In performing the coating, the wafer is fixed by vacuum suction to a supporting plate housed in a treating chamber, i.e., a spinner cup. Then, the supporting plate is rotated by a rotating mechanism. During the rotation, a liquid photoresist is dripped from a nozzle movably disposed above the supporting plate onto the wafer surface. A resist film of a desired thickness is formed on the wafer by controlling the rotation speed and time of the supporting plate while exhausting the atmosphere gas within the spinner cup.

In the conventional method described above, it is important to control accurately the wafer rotation speed and the exhaust rate of the gas from the spinner cup in order to form a resist film of a uniform thickness substantially free from micro projections. If the exhaust rate is unduly high, the flow speed of the atmosphere gas becomes excessively high around the wafer. As a result, the resist film formed is waved or striped, failing to obtain a film of a uniform thickness. On the other hand, if the exhaust rate is unduly low, the mist of photoresist thrown away from the wafer by the rotation is attached again to the wafer surface, with the result that micro projections are formed on the surface of the resist film.

To overcome these problems, it is proposed to change the gas exhaust rate in accordance with the coating operation in Unexamined Published Japanese Patent Application No. 59-82975. Also proposed are gas exhaust rate control mechanisms including the use of an exhaust gas control valve such as an electromagnetic valve, or a gas exhaust means such as a suction pump, and the use of a flap disposed in an exhaust pipe, the degree of opening of said flap being controlled (See Unexamined Published Japanese Patent Applications 58-178522; 62-102854; and 60-139363). However, the gas exhaust rate control mechanisms proposed in the past are incapable of accurately controlling the gas exhaust rate and are poor in response characteristics.

SUMMARY OF THE INVENTION

An object of the present invention is to provide a coating apparatus which permits quantitatively setting the gas exhaust rate with a high reproducibility so as to carry out the coating of a treating liquid stably and with a high accuracy.

Another object is to provide a coating apparatus in which the size of an opening of the exhaust section is consecutively changed so as to control accurately the gas exhaust rate. Still another object is to provide a coating apparatus which permits changing the gas exhaust rate in accordance with the coating state of a treating liquid.

According to the present invention, there is provided a coating apparatus, comprising:

a cup for putting in or out an object to be treated;
an exhaust port formed in said cup;
an exhaust pipe connected to said exhaust port;
a suction mechanism connected to said exhaust pipe;
an exhaust rate controller disposed within said exhaust pipe positioned between said suction mechanism and the cup;
a branched pipe branched at the exhaust pipe positioned between the suction mechanism and the cup, one end portion of said branched pipe being open to the atmosphere;
a flow meter mounted in said branched pipe; and
a control section for supplying a predetermined exhaust rate control signal to the exhaust rate controller in accordance with the output signal generated from said flow meter.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1 illustrates the construction of a resist coating apparatus according to one embodiment of the present invention;

FIG. 3 shows changes with time in the rotation speed and exhaust rate of the resist coating apparatus shown in FIG. 1.

DETAILED DESCRIPTION OF THE PREFERRED EMBODIMENT

Figure 2:
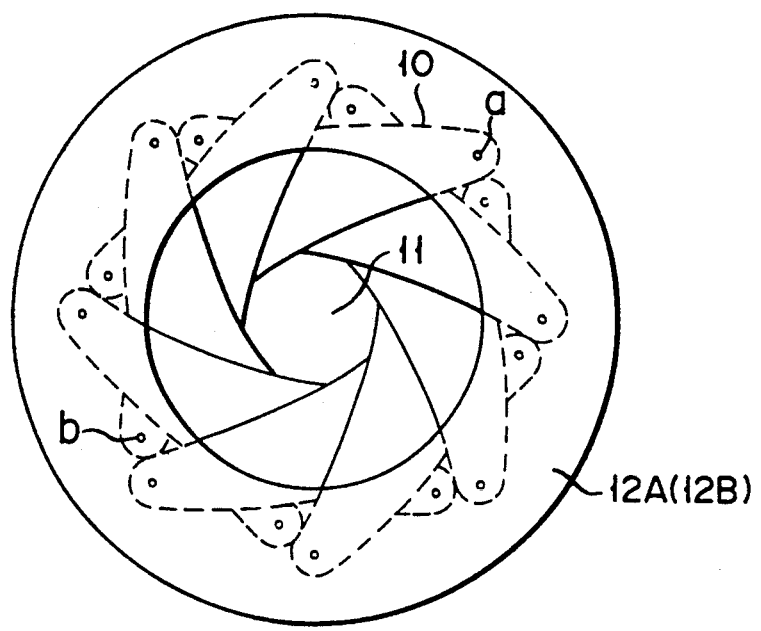
FIG. 2 is a plan view showing an example of a iris diaphragm mechanism.

Let us describe in the following a coating apparatus according to one embodiment of the present invention with reference to the accompanying drawings.

FIG. 1 shows the construction of a resist coating apparatus of the present invention. As seen from the drawing, the coating apparatus comprises a spinner cup 1. A wafer support plate 3, which is rotated at a predetermined speed by a rotating mechanism 2, is housed in the spinner cup 1. A semiconductor wafer 4 is fixed by vacuum suction to the support plate 3, and a nozzle 5 is disposed above the support plate 3 in a manner to face the wafer 4. A liquid photoresist is dripped from the nozzle 5 onto the surface of the wafer 4.

An annular exhaust port 6 is formed along the corner portion of the bottom of the cup 1, and an exhaust pipe 7 is provided to communicate with the exhaust port 6. Further, a blower 8 is connected to the exhaust pipe 7. The atmosphere gas introduced from above the spinner cup 1 is also exhausted by the blower 8 into a clean room (not shown).

As seen from the drawing, an iris diaphragm mechanism 9 is disposed in the exhaust pipe 7 which extends between the bottom portion of the cup 1 and the blower 8 so as to control the gas exhaust rate from the cup. The iris diaphragm mechanism 9 is constructed such that the degree of opening in its central portion can be consecutively changed.

To be more specific, FIG. 2 is a plan view showing an example of the iris diaphragm mechanism 9. It is seen that the mechanism 9 comprises plates 10. In this embodiment, eight metal pieces 10 are superposed one upon the other at one end portion so as to form a substantially circular opening 11 in the central portion of the metal piece arrangement. The metal piece arrangement is held between metal rings 12A and 12B. One end portion of the metal piece 10 is rotatably pivoted at point (a), or point (b), to the metal ring 12A (or 12B), with the other end portion being rotatably pivoted at point (b), or point (a), to the metal ring 12B (or 12A). It should be noted that each of the metal piece 10 is rotatable about the pivoting point (a) or (b). If the metal ring 12A is rotated, with the metal ring 12B held stationary, the metal piece 10 is rotated so as to change the size of the opening 11 formed in the central portion.

In the embodiment shown in FIG. 2, a large number of teeth are formed along the outer circumferential surface of the metal ring 12B. A gear 15 shown in FIG. 1, which is engaged with the teeth formed in the metal ring 12B, is mounted to, for example, a rotary shaft 14a of a stepping motor 14. It follows that the metal ring 12B is rotated by the driving of the stepping motor 14 so as to control the size of the opening 11 of the iris diaphragm mechanism 9. A driving control signal Is supplied from a system controller 20 to the stepping motor 14, with the result that the rotating direction and the rotating angle of the stepping motor 14 are controlled.

A bypass pipe 17 is branched from that portion of the exhaust pipe 7 which is positioned between the wafer support plate 3 and the iris diaphragm mechanism 9. A diameter of bypass pipe 17 is settled in 4 mm to 10 mm. In this case, bypass pipe has a diameter of about 6 mm. The tip portion of the bypass pipe 17 is open to the outer atmosphere. A flow meter 18 for measuring the flow rate of an atmosphere gas flowing from the outer atmosphere into the exhaust pipe 7 through the bypass pipe 17 is mounted at the bypass pipe 17.

It should be noted that the flow meter 18 and the bypass pipe 17 collectively form an exhaust rate detecting means 16. To be more specific, the gas exhausted from the exhaust port 6 of the spinner cup 1 flows at a predetermined flow rate through the exhaust pipe 7, with the result that the pressure within the exhaust pipe 7 is lower than the atmospheric pressure. It follows that the outer atmosphere is sucked through the bypass pipe 17 into the exhaust pipe 7. In this case, the amount Q of the outer atmosphere sucked through the bypass pipe 17 is determined by the difference between the pressure P within the exhaust pipe 7 and the atmospheric pressure Po, i.e., P - Po, though the amount Q in the case where the gas flow within the bypass pipe forms a stratified flow differs from the amount Q in the case where the gas flow within the bypass pipe forms a turbulent flow, as shown below:

$Q = K_1(P-Po)$ ... (stratified flow)
$Q = K_2/P-Po$ ... (turbulent flow)

Each of $K_1$ and $K_2$ in the formulas given above denotes a constant.

What should be noted is that it is possible to detect the gas flow rate within the exhaust pipe 7 by measuring the gas flow rate (1/min) within the bypass pipe 17.

A signal denoting the gas flow rate within the bypass pipe 17 is supplied to a gas flow rate detecting circuit 19 connected to the flow meter 18, and the signal supplied to the gas flow rate detecting circuit is converted into a signal denoting the gas flow rate within the exhaust pipe 7. Further, the signal denoting the gas flow rate within the exhaust pipe 7 is supplied to the system controller 20 which is connected to the exhaust rate detecting circuit 19. The output signal of the system controller 20, which corresponds to the input signal supplied from the exhaust rate detecting circuit 19, is supplied to the rotation mechanism 2 and to the stepping motor 14.

Let us describe the operation of the coating apparatus of the construction described above with reference to FIG. 3. Specifically, the exhaust rate is controlled in accordance with the rotation speed of the wafer 4. It should be noted that the rotation speed of the wafer and the gas exhaust rate are programmed in advance in the system controller 20. The rotation mechanism 2 is controlled by the system controller 20 in accordance with the program, with the result that the rotation speed of the wafer 4 is controlled. The output signal of the system controller 20 is also supplied to the stepping motor 14 connected to the iris diaphragm mechanism 9 so as to control the rotating angle and the rotation speed of the stepping motor 14. In this case, the blower 8 sucks a predetermined amount of the gas within the exhaust pipe 7.

In performing the coating operation, a liquid photoresist is dripped onto the wafer 4. As shown in FIG. 3, the rotation speed of the wafer support plate 3 is accelerated by the rotation mechanism 2 such that the rotation speed is increased to reach 1,000 rpm within 0.1 second. At the same time, the size of the opening 11 of the iris diaphragm mechanism 9 is controlled to permit the gas exhaust rate to reach 0.1 to 1 m²/min within 0.1 second. These rotation speed and the gas exhaust rate are kept unchanged for the succeeding 2 to 4 seconds. During this period, the photoresist dripped onto the wafer is expanded over the entire surface of the wafer. Thus, the wafer 4 should be rotated at a relatively low speed and the gas exhaust rate should be held at a low level during this period. If the gas exhaust rate is excessively high, the expanded photoresist tends to be striped, resulting in failure to form a uniform resist film.

Then, the rotation speed of the wafer is increased to 2,000 to 5,000 rpm. This high speed rotation is continued for 10 to 30 seconds. In accordance with the increase in the rotation speed of the wafer, the gas exhaust rate is also increased to reach 1 to 5 m²/min, which is continued for 10 to 30 seconds. During this period, the resist film is set at a desired thickness. If the gas exhaust rate is low during this period, the mist of the resist thrown away from the wafer 4 is attached again to the wafer surface. To prevent the problem, the gas exhaust rate is also increased in proportion to the rotation speed of the wafer 4.

In the next step, the rotation speed of the wafer is lowered to 2,000 to 3,000 rpm and kept at this level for 5 to 10 seconds. The gas exhaust rate is also lowered in accordance with decrease in the rotation speed of the wafer. During this period, a solvent is dripped onto the periphery of the wafer 4 so as to remove the excess resist at the periphery of the wafer surface. If this solvent treatment is not carried out, the excess resist at the periphery of the wafer 4 tends to peel off during the transportation process so as to cause a dust attachment.

Then, the rotation speed of the wafer is increased to 3,000 to 4,000 rpm. At the same time, the gas exhaust rate is increased to conform with the increased rotation speed of the wafer. The increase rotation speed and the gas exhaust rate are maintained for 5 to 10 seconds so as to centrifugally remove the solvent dripped onto the periphery of the wafer.

The operation described is carried out in accordance with a program stored in advance in a memory means. In other words, the rotation speed of the wafer and the gas exhaust rate are automatically controlled by a central processing unit in accordance with the program stored in the memory means.

As described above in detail, the gas exhaust rate is continuously detected by the exhaust rate detecting means 16, and the size of the opening 11 of the iris diaphragm mechanism 9 is controlled to conform with the detected gas exhaust rate. Also, the gas exhaust rate is controlled in accordance with the rotation speed of the wafer 4, making it possible to achieve the highest coating performance in conformity with the rotation speed of the wafer and, thus, to obtain a satisfactory resist film.

In the embodiment described above, the technical idea of the present invention is applied to a resist coating apparatus. However, the technical idea of the present invention can be applied to any coating apparatus in which a treating liquid such as a developing solution is coated while exhausting the gas from within the coating apparatus.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A coating apparatus, comprising:
   a cup for receiving an object to be treated;
   an exhaust port formed in said cup;
   an exhaust pipe connected to said exhaust port and having a branch pipe connected thereto;
   a suction mechanism connected to said exhaust pipe;
   an exhaust rate controller disposed within said exhaust pipe which is positioned between the suction mechanism and the cup, on end portion of said branch pipe being open to the atmosphere;
   a flow meter mounted in said branch pipe; and
   a control section for supplying a predetermined exhaust rate control signal to the exhaust rate controller in accordance with an output signal generate by said flow meter.

2. The coating apparatus according to claim 1, wherein a chuck for supporting an object to be treated and a rotation mechanism for rotating said chuck are disposed within said cup.

3. The coating apparatus according to claim 2, wherein the control section is such as to supply a predetermined instruction signal to the rotation mechanism in accordance with the signal generated from the flow meter so as to set the rotation speed of the chuck and the gas exhaust rate controlled by the gas exhaust controller at desired values in accordance with the treating time of the object to be treated.

4. The coating apparatus according to claim 1, wherein the gas exhaust rate controller comprises a plurality of plates arranged to partially overlap with each other such that the diameter of the gas flowing path within the exhaust pipe is changed by controlling the overlapping manner of the metal pieces.

5. The coating apparatus according to claim 4, comprising:
   a pulse motor to change the overlapping manner of the metal pieces included in the gas exhaust rate controller.

6. The coating apparatus according to claim 2, wherein a nozzle for dripping a treating liquid toward the chuck is provided within the cup.

7. The coating apparatus according to claim 6, wherein the chuck is suitable for supporting and rotating semiconductor wafers, comprising:
   means for applying a liquid photoresist to said wafers.

8. The coating apparatus according to claim 3, wherein the control section comprises:
   means for increasing or decreasing the rotation speed of the chuck and the gas exhaust rate controlled by the exhaust rate controller in synchronism with each other.

* * * * *